United States Patent
Platzgummer

(10) Patent No.: US 10,410,831 B2
(45) Date of Patent: Sep. 10, 2019

(54) MULTI-BEAM WRITING USING INCLINED EXPOSURE STRIPES

(71) Applicant: IMS Nanofabrication GmbH, Vienna (AT)

(72) Inventor: Elmar Platzgummer, Vienna (AT)

(73) Assignee: IMS Nanofabrication GmbH (AT)

( * ) Notice: Subject to any disclaimer, the term of this patent is extended or adjusted under 35 U.S.C. 154(b) by 597 days.

(21) Appl. No.: 15/151,937

(22) Filed: May 11, 2016

(65) Prior Publication Data

US 2016/0336147 A1 Nov. 17, 2016

Related U.S. Application Data

(60) Provisional application No. 62/160,200, filed on May 12, 2015.

(51) Int. Cl.
*H01J 37/317* (2006.01)

(52) U.S. Cl.
CPC ... *H01J 37/3177* (2013.01); *H01J 2237/3175* (2013.01); *H01J 2237/31766* (2013.01)

(58) Field of Classification Search
CPC ..... H01J 2237/3175; H01J 2237/31766; H01J 37/3177; G06F 17/5068; G06F 7/705; G03F 1/144; G03F 1/36; G03F 7/70441
See application file for complete search history.

(56) References Cited

U.S. PATENT DOCUMENTS

| | | |
|---|---|---|
| 1,033,741 A | 7/1912 | Sims |
| 1,420,104 A | 6/1922 | Howe et al. |
| 1,903,005 A | 3/1933 | McCuen |
| 2,187,427 A | 1/1940 | Middleton |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith |
| 4,735,881 A | 4/1988 | Kobayashi et al. |
| 4,899,060 A | 2/1990 | Lischke |
| 5,103,101 A | 4/1992 | Neil et al. |
| 5,189,306 A | 2/1993 | Frei |

(Continued)

FOREIGN PATENT DOCUMENTS

| | | |
|---|---|---|
| CN | 202204836 U | 4/2012 |
| EP | 0178156 A2 | 4/1986 |

(Continued)

OTHER PUBLICATIONS

US 9,443,052 B2, 09/2016, Platzgummer et al. (withdrawn)

(Continued)

*Primary Examiner* — Vuthe Siek
(74) *Attorney, Agent, or Firm* — KPPG LLP

(57) ABSTRACT

To irradiate a target with a beam of energetic electrically charged particles, the beam is formed and imaged onto a target, where it generates a pattern image composed of pixels. The pattern image is moved along a path on the target over a region of exposure, and this movement defines a number of stripes covering said region in sequential exposures and having respective widths. The number of stripes are written parallel to each other along a general direction, which is at a small angle to a principal pattern direction of structures to be written within the region of exposure.

12 Claims, 8 Drawing Sheets

(56) References Cited

U.S. PATENT DOCUMENTS

| | | |
|---|---|---|
| 5,260,579 A | 11/1993 | Yasuda et al. |
| 5,369,282 A | 11/1994 | Arai et al. |
| 5,393,987 A | 2/1995 | Abboud et al. |
| 5,399,872 A | 3/1995 | Yasuda et al. |
| 5,533,170 A | 7/1996 | Teitzel et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,866,300 A | 2/1999 | Satoh et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,107,636 A | 8/2000 | Muraki |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley |
| 6,252,339 B1 | 6/2001 | Kendall |
| 6,258,511 B1 | 7/2001 | Okino et al. |
| 6,280,798 B1 | 8/2001 | Ring et al. |
| 6,333,138 B1 | 12/2001 | Higashikawa et al. |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,768,123 B2 | 7/2004 | Giering |
| 6,768,125 B2 | 7/2004 | Platzgummer et al. |
| 6,829,054 B2 | 12/2004 | Stanke et al. |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson |
| 7,214,951 B2 | 5/2007 | Stengl et al. |
| 7,276,714 B2 | 10/2007 | Platzgummer et al. |
| 7,368,738 B2 | 5/2008 | Platzgummer et al. |
| 7,446,601 B2 | 11/2008 | LeChevalier |
| 7,459,247 B2 | 12/2008 | Bijnen et al. |
| 7,671,687 B2 | 3/2010 | LeChevalier |
| 7,683,551 B2 | 3/2010 | Miyamoto et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Heinrich et al. |
| 8,115,183 B2 | 2/2012 | Platzgummer et al. |
| 8,178,856 B2 | 5/2012 | Nakayamada et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,531,648 B2 | 9/2013 | Jager et al. |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 8,859,983 B2 | 10/2014 | Wieland |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,184,026 B2 | 11/2015 | Wieland |
| 9,188,874 B1 | 11/2015 | Johnson |
| 9,269,543 B2 | 2/2016 | Reiter et al. |
| 9,335,638 B2 | 5/2016 | Jager et al. |
| 9,373,482 B2 | 6/2016 | Platzgummer |
| 9,443,699 B2 | 9/2016 | Platzgummer et al. |
| 9,495,499 B2 | 11/2016 | Platzgummer et al. |
| 9,520,268 B2 | 12/2016 | Platzgummer |
| 9,568,907 B2 | 2/2017 | Platzgummer et al. |
| 9,653,263 B2 | 5/2017 | Platzgummer et al. |
| 9,691,589 B2 | 6/2017 | Van De Peut et al. |
| 9,799,487 B2 | 10/2017 | Platzgummer |
| 9,978,562 B2 | 5/2018 | Van De Peut et al. |
| 2001/0028038 A1 | 10/2001 | Hamaguchi et al. |
| 2002/0021426 A1 | 2/2002 | Mei et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsson et al. |
| 2004/0058536 A1 | 3/2004 | Ki |
| 2004/0119021 A1 | 6/2004 | Parker et al. |
| 2004/0157407 A1 | 8/2004 | Qin-Yi et al. |
| 2004/0169147 A1 | 9/2004 | Haruhito et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0212052 A1* | 9/2008 | Wagner ................ G02B 7/028 355/30 |
| 2008/0237460 A1 | 10/2008 | Fragner et al. |
| 2008/0257096 A1 | 10/2008 | Zhu et al. |
| 2008/0260283 A1 | 10/2008 | Ivansen |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0168043 A1 | 7/2009 | Lee |
| 2009/0200495 A1 | 8/2009 | Platzgummer et al. |
| 2009/0249266 A1 | 10/2009 | Pierrat et al. |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandström |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0121208 A1 | 5/2011 | Nakayamada et al. |
| 2011/0204253 A1 | 8/2011 | Platzgummer et al. |
| 2011/0226968 A1* | 9/2011 | Platzgummer ......... B82Y 10/00 250/492.3 |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1* | 6/2012 | Tanaka ................ G01B 15/04 716/112 |
| 2012/0211674 A1 | 8/2012 | Kato |
| 2012/0286169 A1 | 11/2012 | Van de Peut et al. |
| 2012/0286170 A1 | 11/2012 | Van de Peut et al. |

(56) References Cited

U.S. PATENT DOCUMENTS

| | | | |
|---|---|---|---|
| 2012/0288787 A1 | 11/2012 | Choi et al. | |
| 2012/0329289 A1 | 12/2012 | Fujimura et al. | |
| 2013/0070222 A1 | 3/2013 | Fujimura | |
| 2013/0120724 A1* | 5/2013 | Wieland | B82Y 10/00 355/46 |
| 2013/0128247 A1 | 5/2013 | Khuat et al. | |
| 2013/0157198 A1 | 6/2013 | Yoshikawa et al. | |
| 2013/0164684 A1 | 6/2013 | Yamanaka | |
| 2013/0198697 A1 | 8/2013 | Hotzel et al. | |
| 2013/0201468 A1 | 8/2013 | Manakli | |
| 2013/0252145 A1 | 9/2013 | Matsumoto et al. | |
| 2013/0253688 A1 | 9/2013 | Matsumoto et al. | |
| 2014/0042334 A1 | 2/2014 | Wieland | |
| 2014/0158916 A1 | 6/2014 | Fujimura | |
| 2014/0197327 A1 | 7/2014 | Platzgummer | |
| 2014/0240732 A1 | 8/2014 | Tinnemans et al. | |
| 2014/0264066 A1 | 9/2014 | Van De Peut et al. | |
| 2014/0264086 A1 | 9/2014 | Van De Peut et al. | |
| 2014/0322927 A1 | 10/2014 | Morita | |
| 2014/0346369 A1 | 11/2014 | Matsumoto | |
| 2015/0021493 A1 | 1/2015 | Platzgummer | |
| 2015/0028230 A1 | 1/2015 | Platzgummer | |
| 2015/0069260 A1 | 3/2015 | Platzgummer | |
| 2015/0243480 A1 | 8/2015 | Yamada et al. | |
| 2015/0248993 A1 | 9/2015 | Reiter et al. | |
| 2015/0311030 A1 | 10/2015 | Platzgummer et al. | |
| 2015/0311031 A1 | 10/2015 | Platzgummer et al. | |
| 2015/0347660 A1 | 12/2015 | Platzgummer et al. | |
| 2016/0012170 A1 | 1/2016 | Platzgummer | |
| 2016/0013019 A1 | 1/2016 | Platzgummer | |
| 2016/0071684 A1 | 3/2016 | Platzgummer et al. | |
| 2016/0276131 A1 | 9/2016 | Platzgummer | |
| 2016/0276132 A1 | 9/2016 | Platzgummer | |
| 2017/0357153 A1 | 12/2017 | Platzgummer | |
| 2018/0218879 A1 | 8/2018 | Platzgummer et al. | |
| 2019/0066976 A1 | 2/2019 | Platzgummer et al. | |

FOREIGN PATENT DOCUMENTS

| | | | |
|---|---|---|---|
| EP | 0928012 | A2 | 7/1999 |
| EP | 1033741 | A2 | 9/2000 |
| EP | 1993118 | A2 | 11/2008 |
| EP | 2019415 | A1 | 1/2009 |
| EP | 2187427 | A2 | 5/2010 |
| EP | 2190003 | A2 | 5/2010 |
| EP | 2214194 | A1 | 8/2010 |
| EP | 2317535 | A2 | 5/2011 |
| EP | 2363875 | A1 | 9/2011 |
| EP | 2950325 | A1 | 12/2015 |
| EP | 2993684 | A1 | 3/2016 |
| EP | 3037878 | A1 | 6/2016 |
| GB | 2349737 | A | 11/2000 |
| JP | 08213301 | A | 8/1996 |
| JP | 2006019436 | A | 1/2006 |
| JP | 2006332289 | | 12/2006 |
| JP | 2010098275 | A | 4/2010 |
| WO | 2006084298 | A1 | 8/2006 |
| WO | 2008053140 | A1 | 5/2008 |
| WO | 2009147202 | | 12/2009 |
| WO | 2012172913 | A1 | 12/2012 |

OTHER PUBLICATIONS

Extended European Search Report for European Application No. 17187922.4, Search completed Feb. 21, 2018, dated Mar. 6, 2018, 7pgs.

Extended European Search Report for European Application No. 17191553.1, Search completed Mar. 22, 2018, dated Apr. 9, 2018, 5pgs.

Extended European Search Report for European Application No. 17153506, Search completed Oct. 5, 2017, dated Oct. 16, 2017, 2 Pgs.

"Dither", Wikipedia, Retrieved from https://en.wikipedia.org/w/index.php?title=Dither&oldid=762118152 on Oct. 5, 2017.

"Ordered dithering", Wikipedia, Retrieved from https://en.wikipedia.org/w/index.php?title=Ordered_dithering&oldid=759840417 on Oct. 5, 2017.

Hinterberger, "Ion optics with electrostatic lenses", University of Bonn, Germany, 2006, 18 pgs.

Kim et al., "Binary-encounter-dipole model for electron-impact ionization", Phys. Rev. A, Nov. 1994, 50, 3954.

Vink et al., "Materials with a high secondary-electron yield for use in plasma displays", Applied Physics Letters, Mar. 25, 2002, vol. 80, No. 12, pp. 2216-2218.

European Search Report for Application 08450077.6, report dated Jan. 29, 2010, 2 pgs.

European Search Report for Application 09450211.9-1226, report dated Sep. 14, 2010, 4 pgs.

European Search Report for application 09450212.7; dated Sep. 28, 2010, 9 pgs.

European Search Report for Application 141501197.7, report dated Jun. 6, 2014, 2 pgs.

European Search Report for Application 14165967, report dated Oct. 30, 2014, 2 pgs.

European Search Report for Application 14165970, report dated Jun. 18, 2014, 2 pgs.

European Search Report for Application 14170611, report dated Nov. 4, 2014, 3 pgs.

European Search Report for Application 14176563, report dated Jan. 14, 2015, 2 pgs.

European Search Report for Application 14177851; report dated Oct. 16, 2014; 1 page.

European Search Report for Application 14199183, report dated Jun. 19, 2015, 2 pgs.

European Search Report for Application 15159397.7, report dated Sep. 28, 2015, 7 pgs.

European Search Report for Application 15159617.8, report dated Oct. 19, 2015, 3 pgs.

European Search Report for Application 15164770, report dated Sep. 18, 2015; 2 pgs.

European Search Report for Application 15164772, report dated Sep. 11, 2015, 2 pgs.

European Search Report for Application 15169632, report dated Oct. 20, 2015, 3 pgs.

European Search Report for Application 15171348, report dated Oct. 30, 2015, 2 pgs.

European Search Report for EP 14176645, completed Dec. 1, 2014, 1 pg.

European Search Report for EP Application No. 16174185, Search Completed Dec. 6, 2016, 2 pgs.

European Search Report for European Application 10450070.7 dated May 7, 2012, 13 pgs.

European Search Report for European Application No. 16160622, Search completed Jul. 21, 2016, dated Jul. 21, 2016, 3Pgs.

European Search Report for European Patent Application 16160621, Report Completed Oct. 5, 2016, 3 pgs.

Berry et al., "Programmable aperture plate for maskless high-throughput nanolithography", J. Vac. Sci. Technol., Nov./Dec. 1997, vol. B15, No. 6, pp. 2382-2386.

Borodovsky, "EUV, EBDW—ARF Replacement or Extension?", KLA-Tencor Lithography User Forum, Feb. 21, 2010, San Jose, CA, USA, 21 pgs.

Borodovsky, "MPProcessing for MPProcessors", SEMATECH Maskless Lithography and Multibeam Mask Writer Workshop, May 10, 2010, New York, NY, USA, 35 pgs.

Disclosed Anonymously, "Multi-tone rasterization, dual pass scan, data path and cell based vector format", IPCOM000183472D, printed from ip.com PriorArtDatabase, published May 22, 2009, 108 pages.

Huber et al., "Computing Straight Skeletons and Motorcycle Graphs: Theory and Practice", Thesis, Univ. of Salzburg (Austria) Jun. 2011, 134 pgs.

Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8.

(56) References Cited

OTHER PUBLICATIONS

Li et al., "Through-Silicon Interposer Technology for Heterogeneous Integration", Future Fab Intl., Issue 45, Apr. 25, 2013, 6 pgs.
Palfrader et al., "Computing Mitered Offset Curves Based on Straight Skeletons", Computer-Aided Design & Applications, vol. 12, No. 4, Feb. 11, 2015, pp. 414-424.
Paraskevopoulos et al., "Scalable (24-140 Gbps) optical data link, well adapted for future maskless lithography applications", Proc. SPIE vol. 7271, 72711 I (2009), 11 pgs.
Platzgummer et al., "eMET—50keV electron Mask Exposure Tool Development based on proven multi-beam projection technology", Proc. of SPIE, 2010, vol. 7823, pp. 782308-1-782308-12.
Platzgummer et al., "eMET POC: Realization of a proof-of-concept 50 keV electron multibeam Mask Exposure Tool", Proc. of SPIE, 2011, vol. 8166, pp. 816622-1-816622-7.
Shih, "Image processing and mathematical morphology: fundamentals and applications", CRC Press, 2009, pp. 26-32.
Wheeler et al., "Use of Electron Beams in VLSI", G.E.C.Journal of Science and Technology, General Electric Company. Wembley, Middlesex, GB, vol. 48, No. 2, Jan. 1, 1982, pp. 103-107, XP000820522.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.
Extended European Search Report for European Application No. 16169216.5, Search completed Sep. 21, 2016, dated Sep. 29, 2016, 12 Pgs.
Extended European Search Report for European Application No. 18150797.1, Search completed Jun. 29, 2018, dated Jul. 9, 2018, 8 Pgs.

* cited by examiner

MULTI-BEAM WRITING USING INCLINED EXPOSURE STRIPES

CROSS-REFERENCE TO RELATED APPLICATION

The current application claims priority to U.S. Provisional Application No. 62/160,200, entitled "Multi-Beam Writing Using Inclined Exposure Stripes," filed May 12, 2015, the disclosure of which is incorporated by reference herein its entirety.

FIELD OF THE INVENTION AND DESCRIPTION OF PRIOR ART

Many embodiments of the invention relate to a method for forming a pattern on a surface of a substrate or target using a beam of energetic electrically charged particles. More in detail, certain embodiments of the invention relate to a method for exposing a desired pattern on a target with a beam of energetic radiation comprising electrically charged particles, comprising:
  providing a pattern definition device having a plurality of apertures transparent to said radiation,
  illuminating said pattern definition device using an illuminating wide beam, which traverses the pattern definition device through said apertures thus forming a patterned beam consisting of a corresponding plurality of beamlets,
  forming said patterned beam into a pattern image on the location of the target, said pattern image comprising the images of at least part of the plurality of apertures covering a number of pattern pixels on the target, and
  generating a relative movement between said target and the pattern definition device producing a movement of said pattern image on the target along a path over at least one region of exposure where a beam exposure is to be performed, where this path is composed of sections which extend along a general direction, and the path sections correspond to exposure stripes covering said region in sequential exposures; said region is composed of a plurality of pattern pixels arranged in a regular arrangement and has a total width as measured across said general direction, whereas the exposure stripes run substantially parallel to each other along said general direction and have respective widths as measured across said general direction.

Methods of the above-described type and charged-particle multi-beam processing apparatuses employing such methods are well-known in prior art. In particular, the applicant has realized charged-particle multi-beam devices as described in several patents in the name of the applicant with respect to the charged-particle optics, pattern definition (PD) device, and multi-beam writing methods employed therein. For instance, a 50 keV electron multi-beam writer which allows to realize leading-edge complex photomasks for 193 nm immersion lithograph, of masks for EUV lithography and of templates (1x masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. Multi-beam processing apparatuses of the said kind are hereinafter referred to as multi-beam writer, or short MBW.

As a typical implementation of an MBW, the applicant has realized a 50 keV electron writer tool implementing a total beam size of 20 nm comprising 512×512 (=262,144) programmable beamlets within a beam array field of dimensions 81.92 µm×81.92 µm at the substrate. In this system, which is referred to as "MBMW tool" hereinafter, the substrate is, typically, a 6" mask blank (having an area of 6"×6"=152.4 mm×152.4 mm and thickness 1"/4=6.35 mm) covered with an electron beam sensitive resist; furthermore, multi-beam writing is possible on resist-covered 150 mm Si wafers as well.

The current density of a typical MBW, such as the MBMW tool, is no higher than 1 A/cm$^2$ when using 20 nm beam size. Thus, when all programmable 262,144 beamlets are "on" the maximum current is 1.05 µA. In this implementation the 1 sigma blur of the MBW column is approx. 5 nm, as verified experimentally.

There is the possibility to change the beam size, e.g., from 20 nm to 10 nm. For a column with 200:1 reduction this is straightforward by using a different aperture array plate (AAP), with 2 µm×2 µm opening size of the apertures instead of 4 µm×4 µm opening size. As outlined in U.S. Pat. No. 8,546,767 of the applicant, a change of the beam size may also be realized in-situ by spatial adjustment of the AAP having multiple aperture arrays of different geometric parameters, such a total size, aperture spacing, aperture shapes etc.

When using a 10 nm beam size and providing a current density at the substrate of no higher than 4 A/cm$^2$, the current of 262,144 programmable beamlets (with all beamlets "on") is again 1.05 µA at maximum. Thus, also in this case there is virtually no change of the 1 sigma blur of the column with current through the column.

The first generation MBW production machines are targeted to use 20 nm and 10 nm beams providing up to approx. 1 µA current for all 262,144 programmable beams "on". For following generations of MBW production machines there is the plan to use even smaller beam size, for instance of 8 nm, and concurrently to provide e.g. 640×640=409,600 beamlets within the 81.92 µm×81.92 µm beam array field at the substrate. Keeping the maximum current density at 4 A/cm$^2$ will ensure that the maximum current (with all beamlets "on") is 1.05 µA. For instance, using a 5 nm beam size allows providing e.g. 1024×1024=1,048,576 programmable beams within the mentioned beam array field at the substrate; again, at a maximum current density of 4 A/cm$^2$ the maximum current (with all beamlets "on") is 1.05 µA.

For industrial applications, very demanding MBW performance requirements are imposed with respect to achieving a small Critical Dimension (CD) and, in particular, to achieving 3sigma or 6sigma variations at a nanometer level of the Local CD Uniformity (LCDU) within small fields (e.g. the area of the MBW beam array field) as well as nanometer level 3sigma or 6sigma variations of the Global CD Uniformity (GCDU) over the whole MBW writing field on a substrate (e.g. a 6" mask blank or a 300 mm Silicon wafer).

Furthermore, it is desired to fine-adjust the line edge position by means of a specifically adapted exposure dose profile. Furthermore, such a fine-adjustment should not only be adaptable within the MBW beam array field (local) but also over the whole MBMW writing field on a substrate (global).

Using the MBW architecture of the applicant, low CD values can be achieved and small LCDU and GCDU values. However, in order to fulfill the very demanding MBW specifications of very low LCDU and GCDU values, there is the need for additional fine corrections. Here, the terms "local" and "global" refer again to small fields (e.g. the area of the MBW beam array field) and the whole MBW writing field on a substrate, respectively.

The patent document U.S. Pat. No. 8,378,320 B2 of the applicant describes a multi-beam writing method, where the target (substrate) is exposed in a sequence of exposure stripes. The exposure stripes are realized by mechanically scanning the substrate in one direction (e.g.: +X) and in the opposite direction (−X) by means of a target stage on which the target is placed. In order to move from one stripe exposure to the next, the substrate is moved in the perpendicular direction by a distance which corresponds to the stripe width or, in the case of overlapping stripes, by a smaller amount depending on the stripe overlap chosen.

However, it was observed that the multi-beam writing method by exposure stripes may, in certain situations, suffer from an effect called "substripes". More in detail, the beamlets may be affected by imperfections, for instance due to deviations of the shape or area of the apertures in the pattern definition device. Thus, some parts of the stripes may incur writing errors at areas with respect to the origin, while leaving other areas unaffected, thus causing striped variation patterns ("substripes") over the exposure area.

In accordance with many embodiments of the present invention, it is possible to average over imperfections and thus compensate this kind of writing errors, namely, by introducing a small angle between the principal pattern direction and the general direction of writing of the stripes. Furthermore, this approach allows for avoiding systematic variations between the substripes at the beginning of a stripe that writes a pattern and the substripes at the end thereof.

In view of the above, it is an objective of many embodiments of the present invention to overcome these shortcomings of prior art.

SUMMARY OF THE INVENTION

The above-mentioned objective is met by a method as described in the beginning wherein for a desired pattern which is composed of a plurality structures having edges oriented along a principal pattern direction, the method includes establishing a relative orientation of the desired pattern and the exposure stripes, with the relative orientation including a non-zero acute angle (non-zero but small) between the principal pattern direction and the general direction of the exposure stripes.

This solution according to many embodiments of the invention enables to overcome the shortcomings of prior art by exploiting a surprisingly simple approach. By virtue of the small deviation of the alignment between the principal pattern direction and the general direction, one beamlet will write to the target at varying values of the axis perpendicular to the principal stripe and pattern direction. Thus, it is possible to average out or altogether avoid the formation of substripes.

It is to be noted that the "principal pattern direction" generally relates to the orientation of a considerable fraction of the edges within the pattern to be exposed on the target. This pattern is usually given as a vector graphics containing a number of components. With the kind of patterns regarded here, most of the components are polygons, which (obviously) are bounded by their edges. (Where the pattern comprises components with rounded edges, such as circles or rings, it will be suitable to ignore these rounded shapes.) In most practical cases all or a majority of the edges are oriented either along or perpendicular to a specific orientation, which is then chosen as the "principal direction". Other orientations of the edges, i.e. at some arbitrary angles to the x-axis, may also occur, but are not prominent in usual pattern layouts.

In many embodiments of the invention, a suitable choice of the value of the angle, when represented in radians, is equal to, or in the order of, the value $\varepsilon_1$ defined as the ratio of the length to the width of the exposure stripes. A typical range of the value will be between $0.5\,\varepsilon_1$ to $2\,\varepsilon_1$.

As mentioned, the desired pattern is usually composed of a plurality of structures which may be defined by their edges. In other words, the edges represent the contours of the structures. These edges may be oriented along various directions, wherein a substantial portion, preferably a majority, of said edges is oriented along the principal pattern direction.

According to a further suitable embodiment of the invention, the stripes within a respective region of exposure may have uniform width and length.

In many embodiments of the invention a target stage is used during generating the relative movement between the target and the pattern definition device, and it may be suitable that this target stage is configured to continuously move the target along a direction of movement, which coincides with either the principal pattern direction or the general direction. In this case, provided a projection system is used to form the patterned beam into a pattern image on the location of the target, it will be advantageous to have the projection system generate a component of the relative movement transversal to the direction of movement of the target.

According to a further embodiment of the invention, an inclined relative orientation of the desired pattern and the exposure stripes may be generated in a manner which includes using a general direction of the exposure stripes where said general direction is rotated by a small non-zero angle from a predefined main direction (such as a defined X-direction on the target) which usually coincides with said principal pattern direction of the pattern. This may be done while the orientation of the pattern itself is kept fixed or in combination with a rotation of the pattern.

According to yet another embodiment of the invention, an inclined relative orientation of the desired pattern and the exposure stripes may be introduced in a manner which includes rotating the desired pattern with respect to the general direction of the exposure stripes by a small non-zero angle prior to performing the beam exposure. In this case, it will usually be suitable to also rotate the orientation of the target by this angle.

It may be worthwhile to remark that in some embodiments of the invention the stripes may overlapping, wherein in the range of overlap of two stripes, nominal positions of pattern pixels of one of the two stripes are overlapping with nominal positions of corresponding pattern pixels of the other of the two stripes, and pattern pixels are exposed in the two overlapping stripes in a complementary manner with regard to the pattern to be imposed.

The sequence of writing a plurality of stripes in a respective region of exposure may be non-consecutive; in other words the plurality of stripes may be distributed into at least two groups of spatially adjacent stripes, and the stripes may be written either in a time sequence wherein each stripe is followed by a non-adjacent stripe of a different group, or in a time sequence wherein the stripes are written in groups of stripes according to the order of the groups, with each group of stripes being followed by a non-adjacent different group.

BRIEF DESCRIPTION OF THE DRAWINGS

In the following, certain embodiments of the present invention are described in more detail with reference to the drawings, which schematically show.

DETAILED DESCRIPTION

It should be appreciated that the invention is not restricted to the embodiments discussed in the following, which merely represent suitable implementations of the invention.

Lithographic Apparatus

Figure 1:
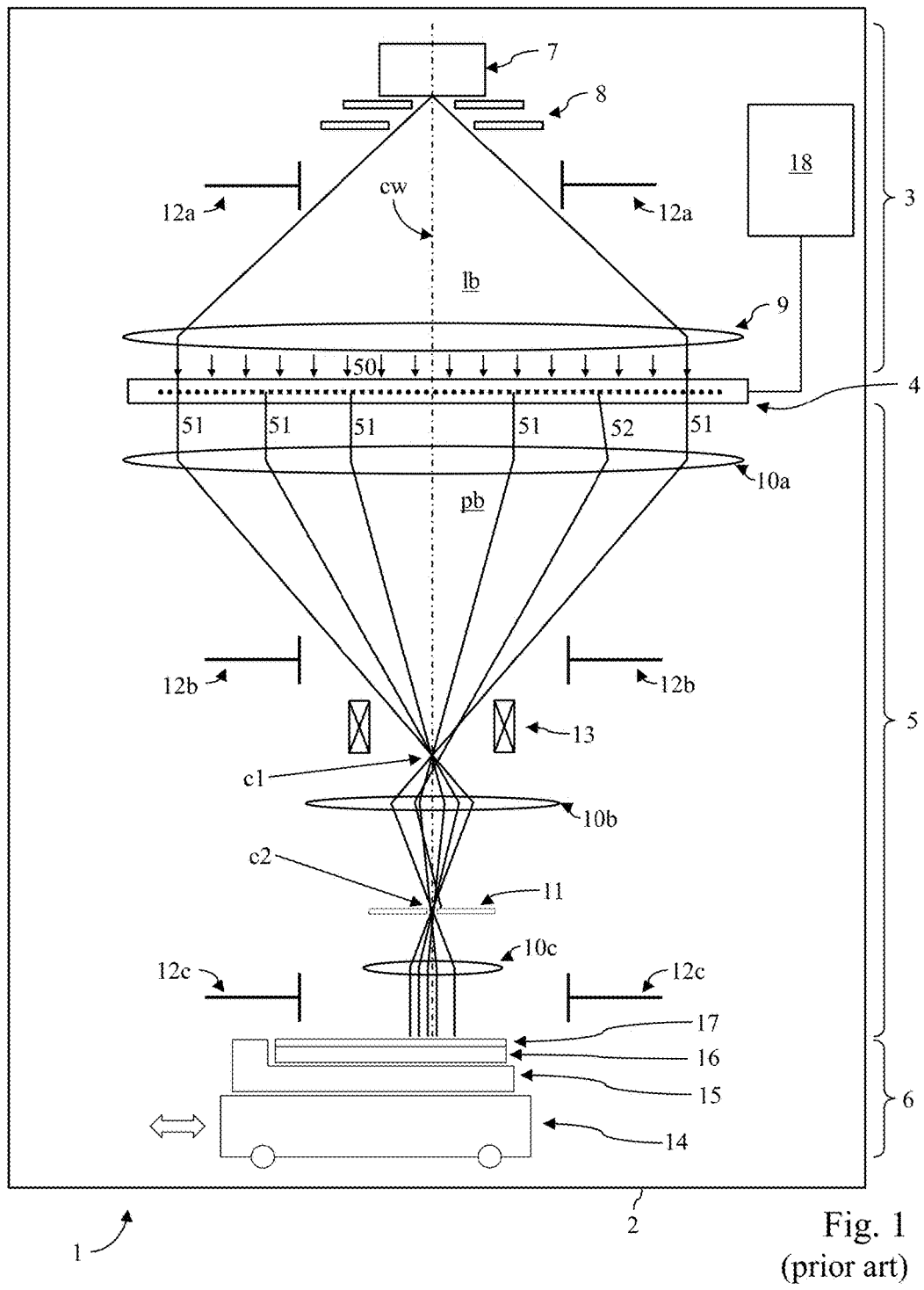
FIG. 1 a MBW system of state of the art in a longitudinal sectional view.

An overview of a lithographic apparatus suitable to employ an embodiment of the invention is shown in FIG. 1. In the following, only those details are given as needed to disclose the described embodiments of the invention such that one of ordinary skill in the art can practice the various embodiments of the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6. The substrate stage 14 is, for instance, an air-bearing X-Y vacuum stage able to perform high stage velocity in X as well as in Y direction.

The information regarding the pattern to be exposed is supplied to the PD system 4 by the data path realized by means of an electronic pattern information processing system 18.

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 8 or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 12a-c are not to be confused with the deflection array means of the PD system 4 in conjunction with the stopping plate 11, as the latter are used to switch selected beam lets of the patterned beam pb "on" or "off", whereas the former only deal with the particle beam as a whole. There is also the possibility to rotate the ensemble of programmable beams using a solenoid 13 providing an axial magnetic field.

Figure 2:
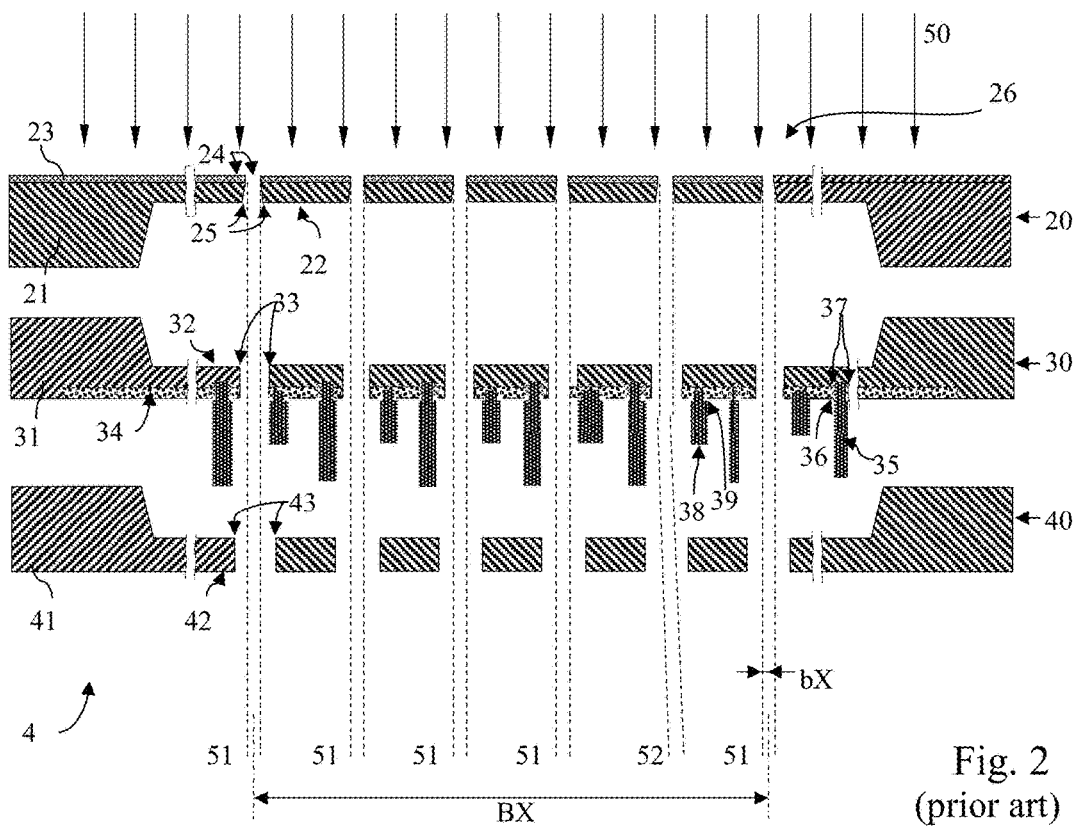
FIG. 2 a pattern definition system state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 5). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 μm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing through (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths BX=AX/R and BY=AY/R, respectively, where AX and AY denote the sizes of the aperture array field along the X and Y directions, respectively. The nominal width of a beamlet at the substrate (i.e. aperture image) is given by bX=aX/R and bY=aY/R, respectively, where aX and aY denote the sizes of the beamlet 51 as measured along the X and Y directions, respectively, at the level of the DAP 30.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 µm×82 µm at the substrate. These examples are stated for illustrative purpose, but are not to be construed as limiting examples.

Figure 3:
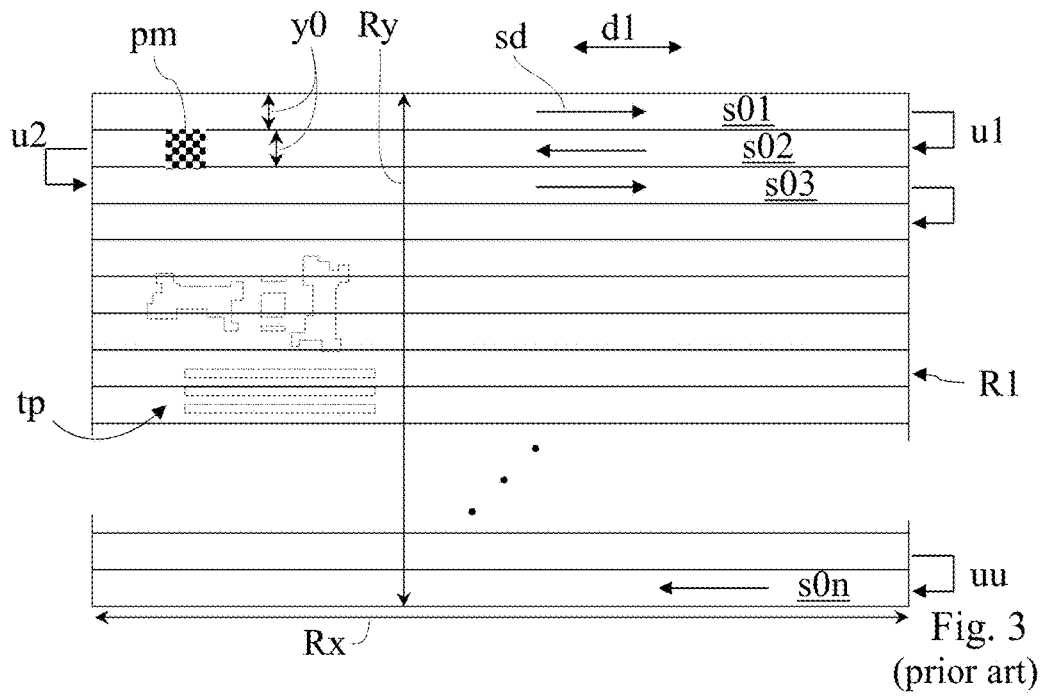
FIG. 3 illustrates the writing strategy on the target using stripes arranged along a common general direction.

Referring to FIG. 3, the BAF forms a pattern image pm on the target 16. The target surface covered with the charged-particle sensitive resist layer 17 will comprise one or more areas R1 to be exposed. Generally, the BAF pm has a finite size y0 which is usually considerably smaller than the width of the exposure area R1, which has dimensions Rx×Ry as measured along the X- and Y-directions, respectively. Therefore, a scanning stripe exposure strategy is utilized, where the target is moved under the incident beam, so as to change the position of the beam on the target perpetually, and thus move the position of the image pattern pm: the beam is effectively scanned over the target surface. It is emphasized that for the purpose of many embodiments of the invention only the relative motion of the pattern image pm on the target is relevant. By virtue of the relative movement the pattern image pm is moved over the area R1 along a path formed by a sequence of stripes s01, s02, s03, . . . s0n (referred to as exposure stripes) of width y0; the stripes extend along a common direction d1, which in the example shown coincides with the X-direction. With respect to the direction of advance, the scanning direction sd may be uniform or may alternate (symbolically, sd=±d1). In particular, FIG. 3 illustrates a path composed of the stripes s01-s0n with alternating scanning direction: At the end of each stripe (but the last) the target stage turns to the start of the next stripe, preferably combined with a reversal of direction while maintaining the general direction d1. Thus, the target stage performs end turns u1, u2, . . . uu between the stripes. It is to be noted that the turns u1-*uu* do not involve an exposure action on the target and, therefore, are not considered part of the path of the pattern image pm on the target.

Thus, the stripes s01-s0n used to write the exposure area R1 are basically parallel, according to the general direction d1. The complete set of stripes covers the total area of the exposure area R1. The term "general direction" is meant to refer to both ways of moving along a given direction on the target plane, such as ±x or ±y, where the symbol ± denotes that both ways belong to the same general direction. Since the width y0 of the stripes, as measured across the general direction d1, is generally small as compared to the width Ry of the area R1 along the same direction across, the exposure area R1 will generally contain a number of stripes, usually a plurality of stripes. Thus, the number of stripes in the exposure Area R1 is typically considerable, depending on the respective application and pattern to be written.

Figure 4:
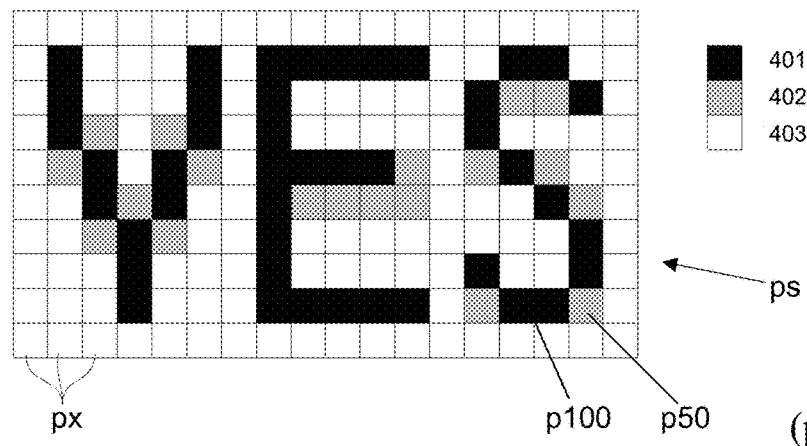
FIG. 4 shows an example of a pixel map of an exemplary pattern to be exposed.

FIG. 4 shows a simple example of an imaged pattern ps with a size of 10×18=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). Of course, in a realistic application of the invention, the number of pixels of the standard image would be much higher. However, in FIG. 4 the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the pattern tp which is intended to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual patterned beam not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously by means of the target stage 14, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$ . . . , $i/(n_y-1)$, . . . , 1 with $n_y$ being the number of gray values and i an integer ("gray index", $0 \le i \le n_y-1$). Generally, however, the gray values need not be equidistant and form a non-decreasing sequence between 0 and 1.

Figure 5:
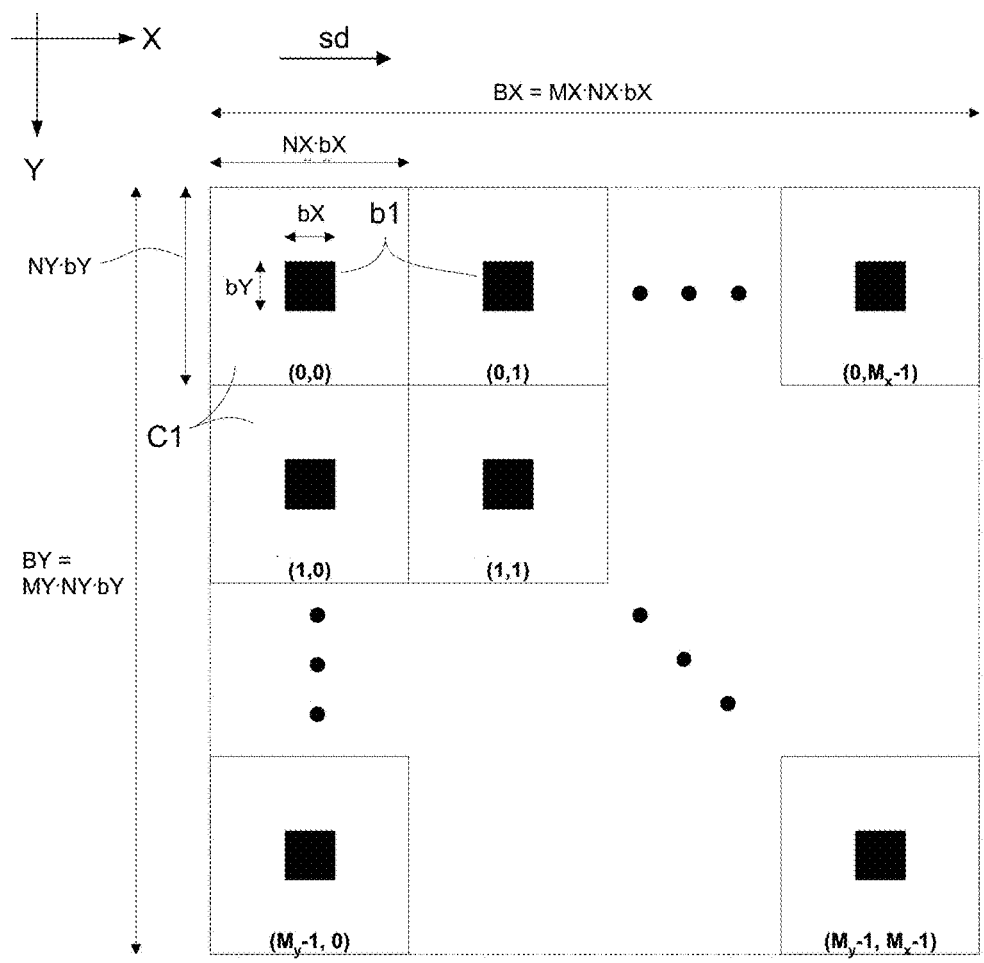
FIG. 5 shows an exemplary arrangement of apertures as imaged onto the target.

FIG. 5 shows the arrangement of apertures in the aperture field of the PD device, according to a basic layout and also illustrates several quantities and abbreviations used in the following. Shown is the arrangement of the aperture images b1 as projected onto the target, shown in dark shades, but regardless of any gray level they may have. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX and NY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

The size of a single aperture image formed on the target is b=bX/R, where bX is the opening width of the apertures in the aperture array plate (AAP) and R is the reduction factor of the charged-particle projection optics.

Figure 6A:
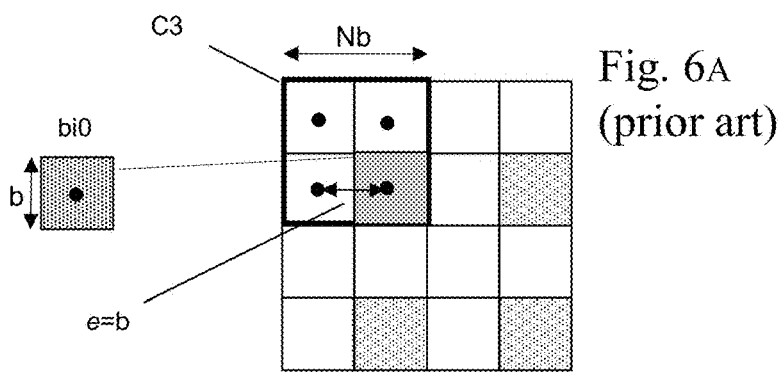
FIG. 6A illustrates an arrangement of apertures with N=2.

The distance between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. Nos. 8,222,621 and 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
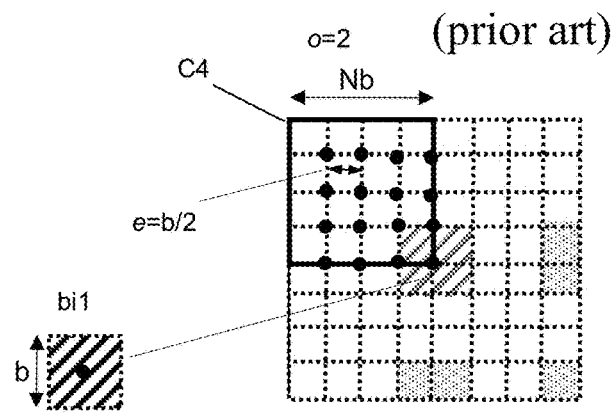
FIG. 6B shows an example of oversampling of the pixels in a "double grid" arrangement.

FIG. 6B illustrates one example of an oversampling of o=2 combined with placement grids. Namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2$=4 pixels in the case of oversampling with o=2 in FIG. 6B (also called "double grid"). Of course, o may take any other integer value as well, in particular 4 ("quad grid"), or also a non-integer value greater one, such as √2=1.414.

The pixel positions in the placement grids may be divided into two or more groups, referred to as "partial grids". For instance, the pixels of the placement grid of FIG. 6A may belong to two partial grids, namely, in an alternating manner according to a checker-board. Placement grids are further explained in U.S. Pat. No. 8,222,621, and partial grids are discussed in US 2015/0028230 A1 in more detail, and the skilled person is referred to those documents with regard to placement grids and partial grids, respectively; the disclosure of those two documents with regard to placement grids and partial grids, respectively, is herewith included by reference.

Figure 7A:
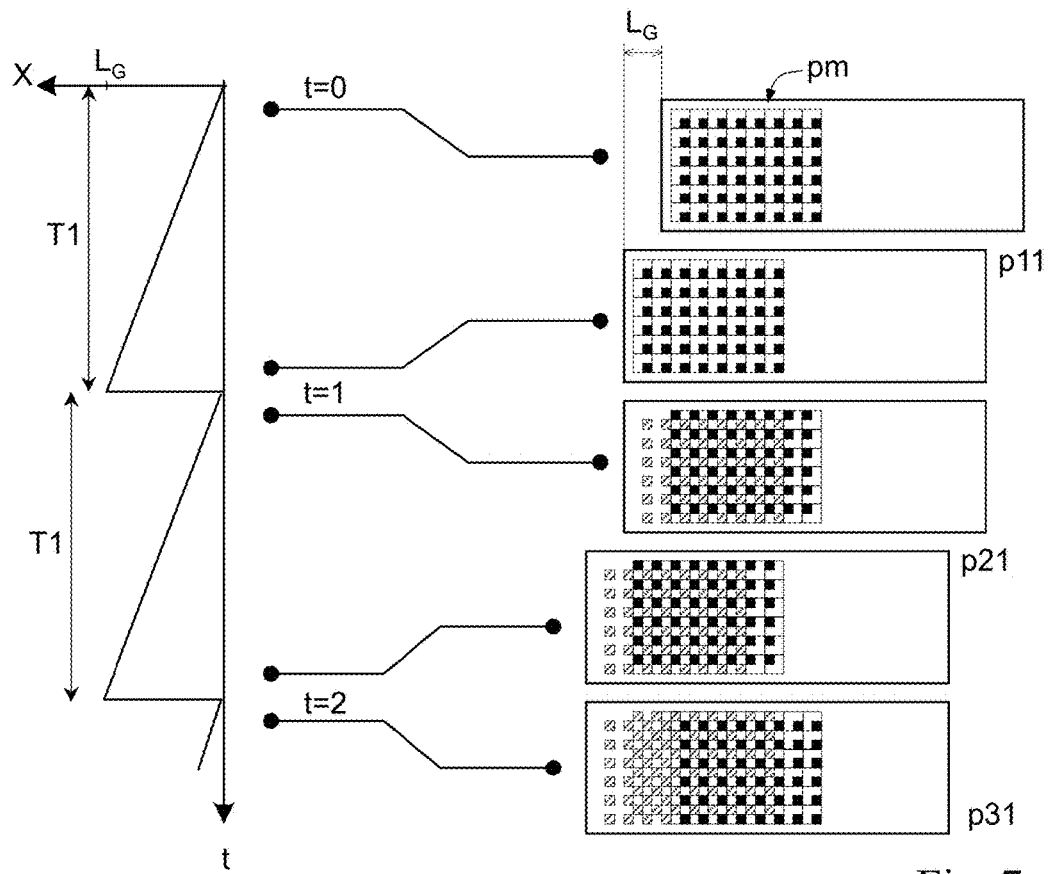
FIG. 7A illustrates the exposure of one stripe.
Figure 7B:
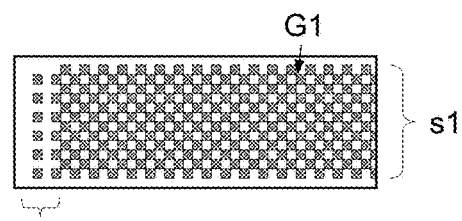
FIG. 7B shows the stripe resulting from the process of FIG. 7A.
Figure 7C:
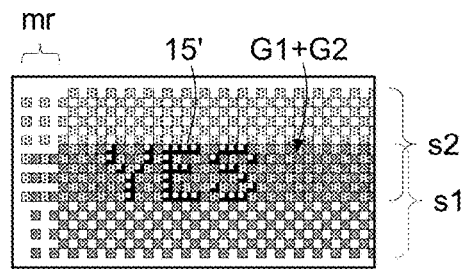
FIG. 7c shows two overlapping stripes.

FIGS. 7A to 7c show an exposure scheme of the pixels for exposing an area on the target which is suitable for many embodiments of the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time T1 for exposure at each placement grid corresponds to a length $L_G$=VT1=L/$(No)^2$=bM/$No^2$, which we call "exposure length".

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 ... p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

With this method it is possible to write stripes of arbitrary length, exposing all pixels of one partial grid G1, as shown in FIG. 7B for the example of stripe s1 associated with grid G1. At the beginning and at the end of the stripe the exposure method may not produce a contiguous covering, so there is a margin mr of width L−$L_G$ that is not completely filled.

As illustrated in FIG. 7c, the exposure of the pixels belonging to the other partial grid G2 (or the other partial grids, in case the number of grids is >2) is done by writing another stripe s21. In the context of the instant application, the placement of the stripes of different grids may be with an offset perpendicular to the scanning direction. Within the area of overlap of the stripes s1, s2, the pixels thus exposed can combine into a complete coverage of the pixels to be exposed. However, the stripes s1, s2 will generally not be exposed in immediately successive order, as explained in more detail below.

Figure 8:
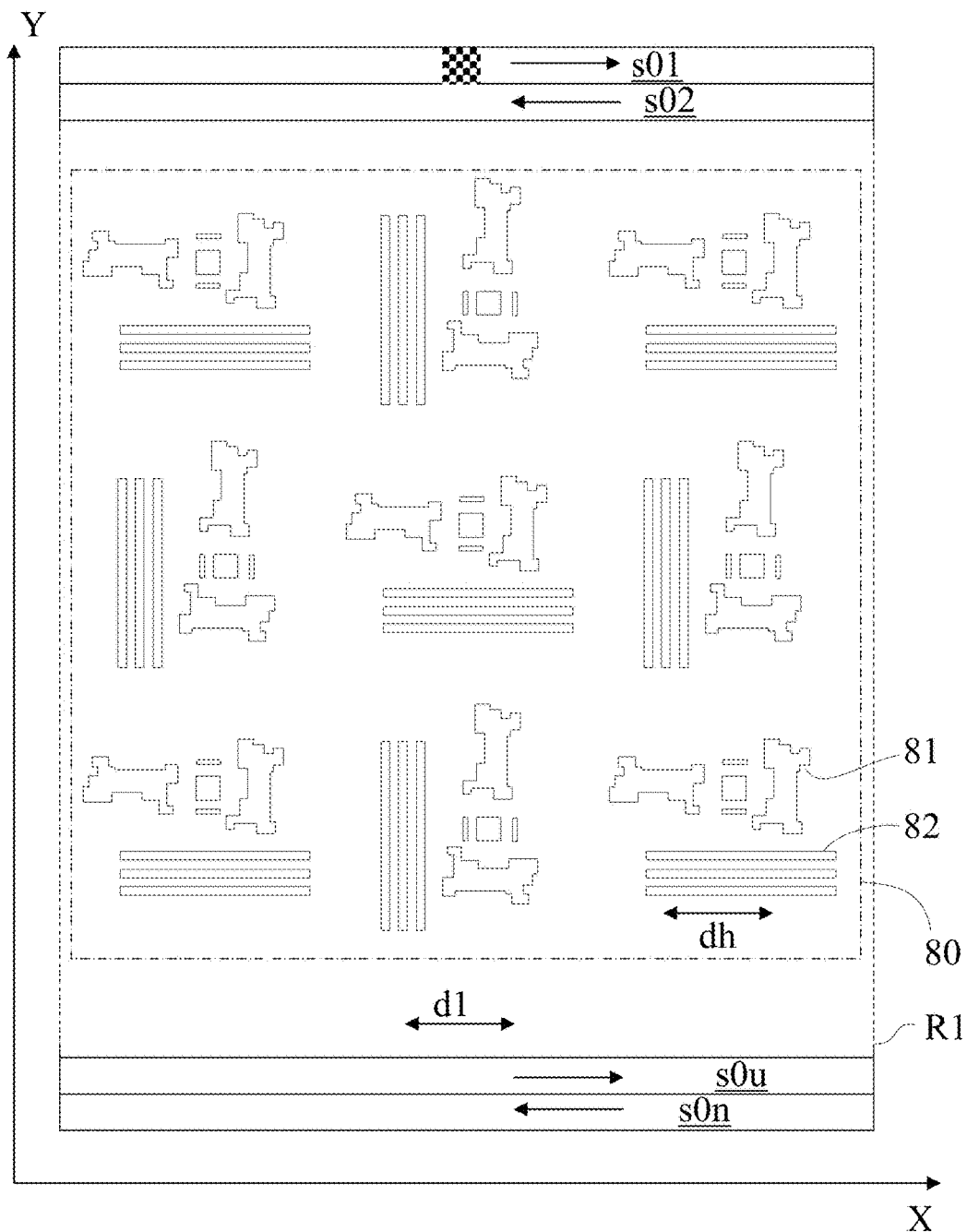
FIG. 8 illustrates the exposure of a desired pattern using the stripe-based writing method according to prior art.

FIG. 8 recapitulates the main elements of the exposure of a desired pattern 80 using the stripe-based writing method according to prior art. The pattern 80, which may be associated with a dedicated area denoted by a dash-dotted rectangle in FIG. 8, is arranged within an area R1 of defined size, referred to as exposure area; generally, a target may comprise several exposure areas which may contain identical or different patterns to be exposed. The exposure area is written by a sequence of stripes s01-s0$n$ in accordance with the preceding discussion of the exposure method. For reasons of clarity only the first two and the last two s01, s02, s0$u$, s0$n$ of the stripes covering the exposure area R1 are shown in FIG. 8. The stripes s01-s0$n$ are written along a common general direction d1, for instance with alternating direction of advance (±d1). Also in accordance with conventional practice, the general direction d1 is chosen such that it aligns, i.e. is parallel, with the main direction of movement X of the target stage 14, i.e., along the X-axis, which allows a fast movement and precise positioning of the target 16 along the direction of movement X. With most conventional target stages, movements that are not aligned with the main direction involve reduced precision, and the movement component across the X-axis, that is along the Y-axis perpendicular thereto, often is considerably slower than along the X-direction.

Further in accordance with common practice in the field, the pattern 80 is composed of several component structures such as long lines 82 of rectangular shapes, pad areas of about square shape, branched or non-branched composite lines composed of several rectangular shapes joined to each other (not shown), and/or more complicated shapes 81. The components are defined by their edges as vector data, typically the edges represent contours of the components. Usually the edges are oriented along either the (local) x- or y-axes; including the edges of a complicated shape 81, whose contour is composed of edge sections along the x- and y-directions respectively. Other orientations of the edges, i.e. at some arbitrary angles to the x-axis, may also occur (not shown in FIG. 8), but are not prominent. A principal pattern direction of the component structures 81, 82 is denoted as dh in FIG. 8, which in the example shown coincides with the (local) x-axis. This principal pattern direction dh corresponds to a direction of a considerable part of the edges of the component structures, and a suitable choice will be the direction of the edges that occurs most often in those structures. The number of occurrence may be counted by the number of edges or by the (sum of) lengths of the edges that extend along the respective direction. In usual cases the principal pattern direction dh will be either the x- or y-direction of the pattern 80.

A conventional choice of the orientation of the pattern 80 is such that the principal pattern direction dh of the components 81, 82 of the pattern 80 is aligned with the general direction d1. A first alignment is made within the tolerance of the loading process of the target, such as a resist-covered substrate, into the target stage. By calibration of the projection system, i.e., rotation of the image of the BAF, as well as a rotation correction of loaded target, which is determined online, the stripe direction is aligned to the X-direction of the target. A typical value of the (angular) alignment obtained this way is at very low angles in the order of or, preferably, better than 15 nrad (nanoradians). With such an accurate alignment as starting point, it is possible to introduce well-defined small, acute angles of the order of several tenth of μrad (microradians) up to 500 μrad or more.

This choice of alignment not only avoids aliasing errors arising from the rasterization, but also allows for reducing the amount of design data and the pattern data to be processed during the writing procedure.

One starting point of many embodiments of the present invention is the observation of possible writing errors that may occur in conjunction with a multi-beam writing approach as described above. With the writing method illustrated in FIG. 8, only a limited number of beamlets will contribute to a pattern element which is aligned along the primary pattern direction dh. This is because the positions of the beamlets within the pattern image (see FIG. 5) is fixed with regard to the location along the direction perpendicular to the primary pattern direction dh. Therefore, a given pixel at the target will "see" only the beamlets produced by a line of apertures in the pattern definition device 4; pixels at different Y-locations will be written by different lines of apertures. However, the beamlets may be affected by imperfections, for instance due to deviations of the shape or area of the apertures in the pattern definition device 4, defects in the deflecting electrodes of the DAP 30 or caused by dose inhomogeneity effects, which are, e.g., introduced by variations on a larger spatial scale of the dose of the incoming primary beam upstream the DAP as well as deviances of the individual beamlets caused by, e.g., variations in the aperture dimensions. Thus, some parts of the stripes may incur writing errors at certain ranges with respect to the Y-axis (more generally, the direction across the direction dh). This is irrespective of the specific type of arrangement of the apertures within the aperture field, such as a staggered arrangement or a regular array as in FIG. 5. This kind of writing errors will may cause formation of striped variation patterns ("substripes") over the exposure area R1, which will repeat for each of the stripes s01-s0$n$ along the Y-axis.

Many embodiments of the present invention offer an approach for dealing with this kind of writing errors, namely, by introducing a small angle between the principal pattern direction and the general direction of writing of the stripes. This small angle lifts the alignment of the direction of writing of the stripes (i.e., the general direction) with the principal pattern direction dh of the pattern 80. While the angle sufficient to lift the alignment between the general direction (of writing the stripes) and the principal pattern direction dh is "small", it is considerably larger than the accuracy of the (angular) alignment, which as mentioned is in the order of or better than 15 nrad.

Figure 9:
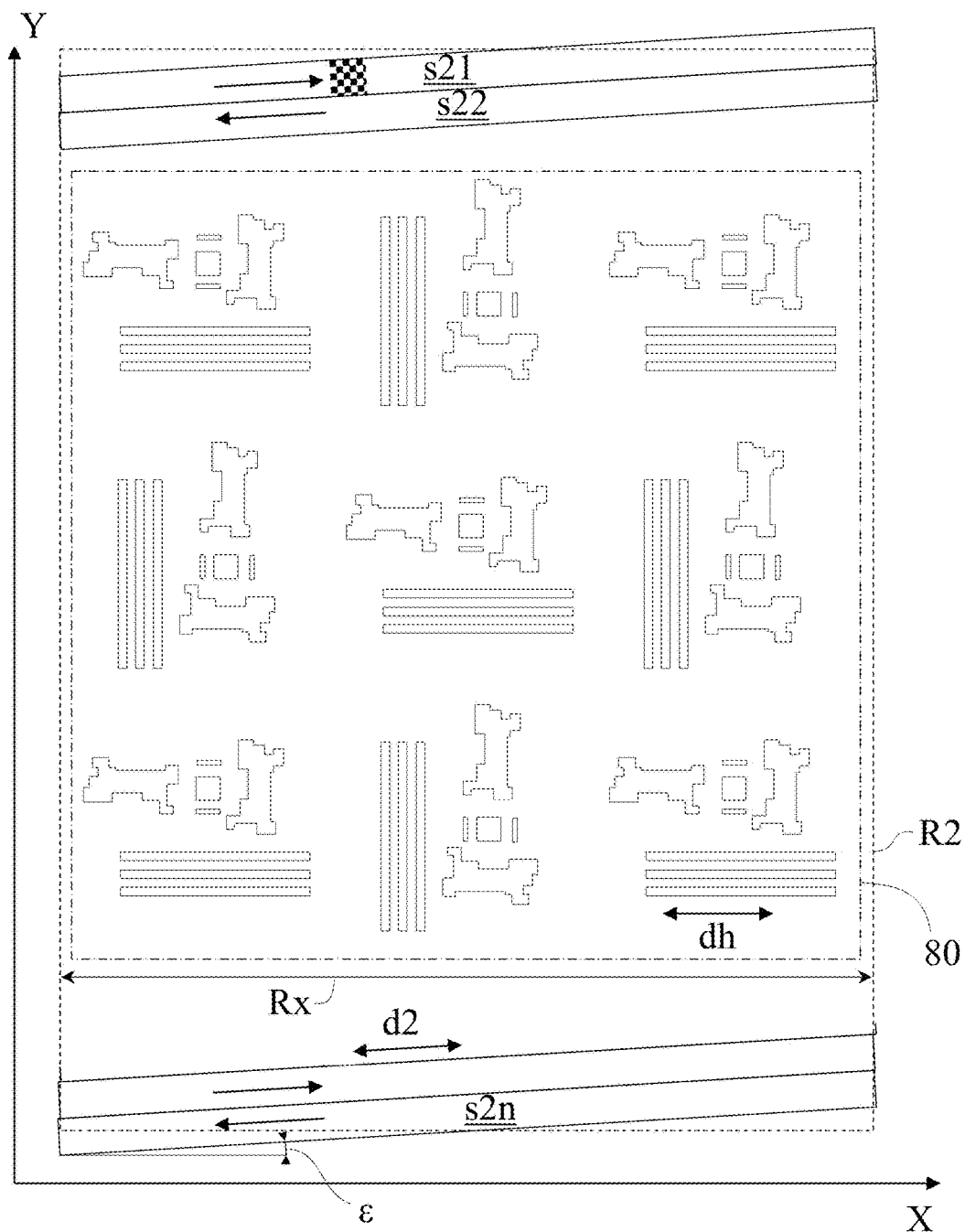
FIG. 9 illustrates the stripe writing method according to a first embodiment of the invention.

As can be seen in the example of FIG. 9, for writing stripes s21, s22, . . . , s2$n$ a general direction d2 is chosen which is slightly inclined with respect to the axis (here, the X-axis) which corresponds to the principal pattern direction dh of the pattern 80 to be written. This small deviation of the alignment between the direction d2 and dh will cause that each of the beamlets will write to the target at varying values of the Y-axis. Thus, with regard to a pattern element at a given height in terms of the Y-axis, i.e., the direction perpendicular to the principal pattern direction dh, all apertures of the aperture array will contribute dose to this pattern element. Consequently, it is possible to average out or altogether avoid the formation of substripes when comparing different substripes of a given, long stripe.

One suitable choice of the angle of inclination ε is determined by the ratio of the width y0 of the stripe (which is equivalent to the width of the pattern image generated by the beam on the target) to the length Rx of a stripe, provided the angle is calculated in radians, exploiting that for a small angle $\varepsilon = \tan \varepsilon = y0/Rx$. This choice ensures that at the end of a stripe, the relative displacement along the Y-axis corresponds to the width y0. For a typical implementation this choice gives a very small angle. For instance, in the MBW mentioned above, where the beam array field has a width of 81.92 µm at the substrate and a typical region to be written may cover several dies or even the whole substrate, thus having a size of up to 140 mm, the angle $\varepsilon$ calculates as 82/140000=0.0005 rad (more exactly, 585 µrad). Also other choices, such as an integer multiple of $y0/Rx = \varepsilon_1$ or a fractional value thereof, may be suitable depending on the application. Generally, it is expected that the angle $\varepsilon$ will be in the order of the value $\varepsilon_1 = y0/Rx$. Since the actual value of the stripe length may not be known in advance, as it depends on the layout of the structure to be written and not on the setup of the MBW apparatus, the angle may be chosen so as to match to a typical range, for instance about 0.5 $\varepsilon_1$ to 2 $\varepsilon_1$.

Generally, the angle $\varepsilon$ will be chosen to be greater than $\varepsilon_1/MY$, where MY is the number of beamlets arranged along the Y direction within the beam array (see FIG. 5). This minimal value is required in order to lift the alignment between the general direction (of writing the stripes) and the principal pattern direction dh; this is because only with this minimal angle, the range of Y values covered by one beamlet (cf. FIG. 5) will connect with the neighboring Y value ranges of neighbor beamlets (as seen along the Y direction perpendicular to the principal direction). In the example mentioned, $\varepsilon_1/MY = 585$ µrad/512≈1.1 µrad.

On the other hand, the angle $\varepsilon$ should be chosen to be small, namely, as $\varepsilon < \varepsilon_{max}$ with an upper bound $\varepsilon_{max}$ which allows for avoiding significant aliasing effects along the edges of the pattern image; a good upper estimate for $\varepsilon_{max}$ is obtained from noting (see FIG. 5) that the pattern image pm contains MX beamlets along the X-direction, giving: $\varepsilon_{max} = 1/MX$. In the example mentioned, $\varepsilon_{max} = 1/512 \approx 1.9$ mrad (which is ≈3.3 $\varepsilon_1$).

The local pattern image may be rotated together with the stripes, or only the direction of the stripe is inclined while keeping the orientation of the pattern image. This is illustrated in FIGS. 10 and 11, respectively, which show a schematic detail of the pattern image writing one stripe.

Figure 10:
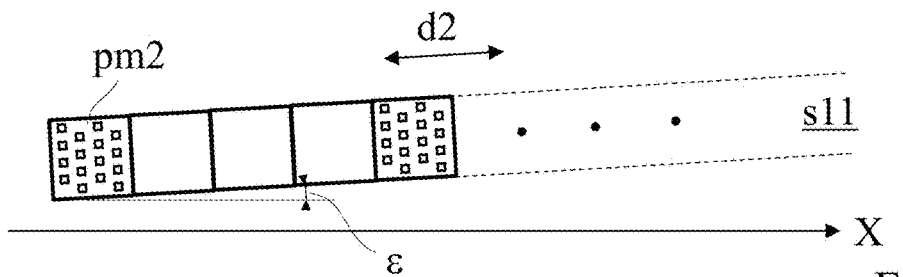
FIG. 10 shows a detail of a stripe being written by the method shown in FIG. 9.

Referring to FIG. 10, the orientation of the pattern image pm2 may be rotated by the same angle of inclination $\varepsilon$, so the orientation is parallel to the general direction of the stripe s11. This layout has the advantage that the raster grid of the pixels is commensurate with the direction of the stripes. It is possible to obtain this rotation of the pattern image pm2 by, for instance, actually rotating the aperture array field in the pattern definition device by the angle of inclination $\varepsilon$, or introducing a rotation of the image in the projection system 5, for instance using a magnetic lens while keeping the aperture array field fixed.

Figure 11:
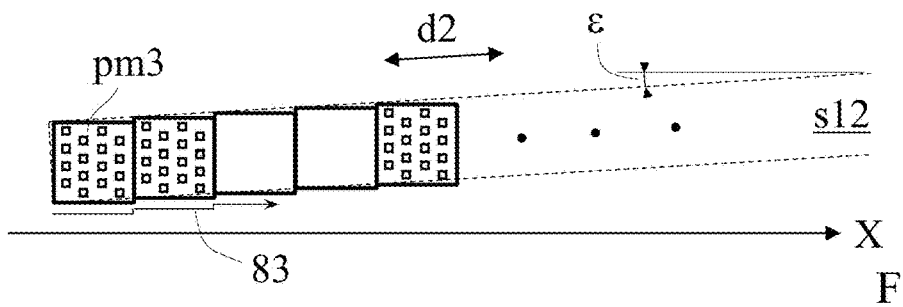
FIG. 11 shows another detail of a stripe being written by a variant of the method using a non-rotated pattern image.

FIG. 11 illustrates a variant where the stripe s12 is written with an inclined general direction d2, but the orientation of the pattern image pm3 matches the X-axis, i.e., corresponds to the principal pattern direction dh. The general direction d2 may be emulated by moving the pattern image pm3 along the X-direction, and every time that the motion had advances by a certain distance, such as the length of the pattern image, a lateral offset (along the Y-direction) is made. The lateral offset is chosen such that it reproduces the slope as defined by the angle $\varepsilon$. The resulting path is that of a stairway, as illustrated by the arrow line 83 in FIG. 11. The lateral offset may be generated by a movement of the target stage or by shifting the pattern image on the target, for instance using one of the deflection means 12a-c means of the projection system 5.

Figure 12:
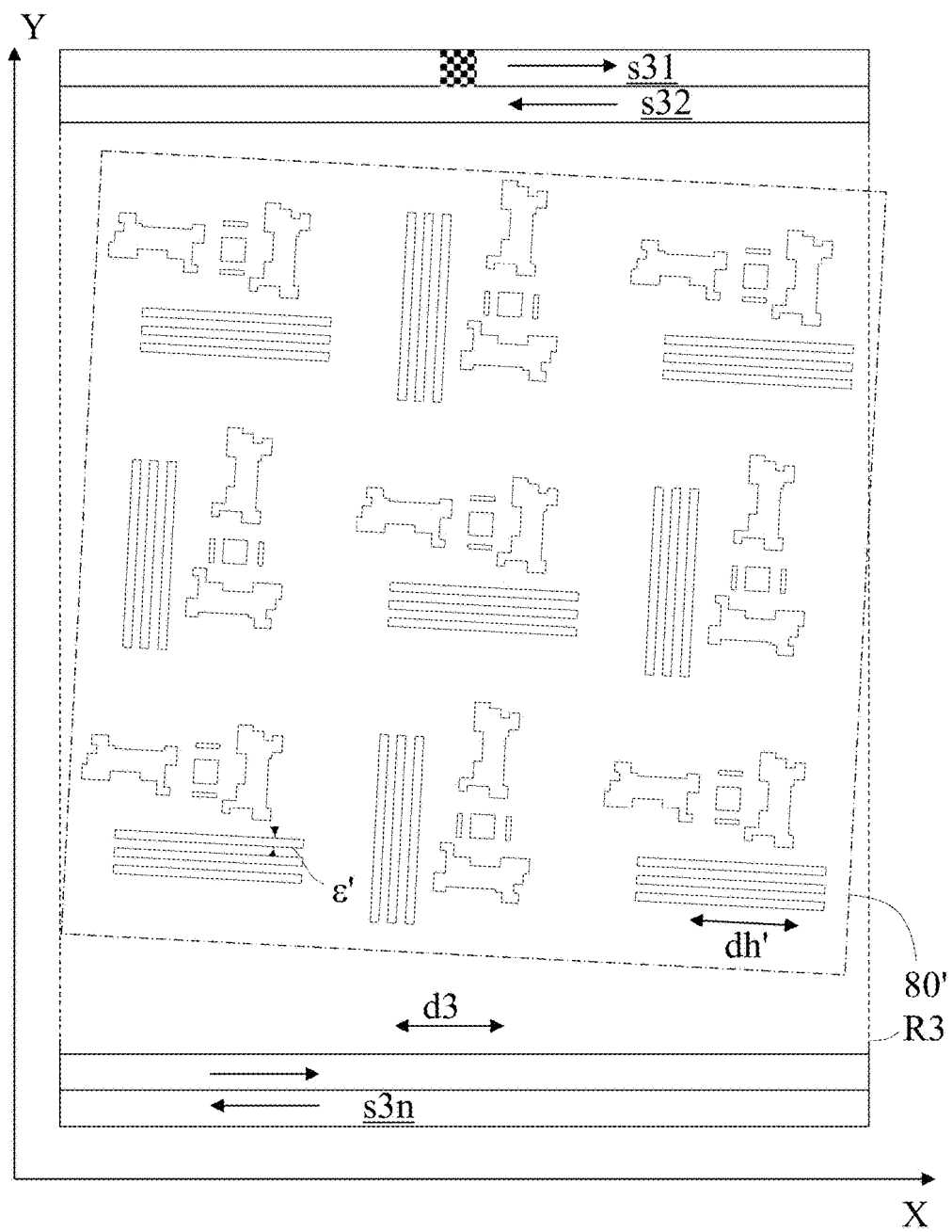
FIG. 12 illustrates the stripe writing method according to another embodiment of the invention.

FIG. 12 illustrates another embodiment of the invention, where the inclination is realized by rotating the desired pattern; this rotation may be performed online on the tool to obtain a rotated intermediate pattern. The desired pattern 80' is rotated by an angle of inclination $\varepsilon'$, which can be chosen to be basically the opposite of the angle $\varepsilon$ of the previous case (FIG. 9). Thus, also the principal pattern direction dh' is inclined by the angle $\varepsilon'$. In this case, the general direction d3 of the stripes s31, s32, . . . , s3n is kept aligned with the X-direction. In a case (not shown here) where the pattern 80' contains elements which would be rotated over a boundary of the exposure area R3, it may be necessary to adapt the size of the exposure area R3 accordingly. At the same time, the substrate is rotated by the same amount in the same direction, so as to maintain the correct orientation of the structure as initially required.

For calculating the layout of the rasterized pattern from the design data with many embodiments of the present invention, several approaches are possible. For instance, the design data, which are given as vector graphics data, may be rotated in the datapath by the angle of inclination $\varepsilon'$. (This basically corresponds to the depiction in FIG. 12.) Alternatively, it is possible to use the standard orientation of the pattern components along the X- and Y-axes, and provide the target stage 14 with a rotation by the angle of inclination $\varepsilon$, using a loading system which provides a mechanical rotation of the substrate loaded as target 16.

As pointed out in US 2015/0028230 A1 it is not necessary that the exposures of stripes within the same area R1 be done one after the other, but may be done in groups, e.g. of three stripes each, with a distance between the groups; in a second run, then, the area is written which was skipped previously. Of course, the number of stripes in each group may take any suitable integer value.

With the methods disclosed here a further reduction of errors can be achieved, in particular with respect to substrate heating.

The invention claimed is:

1. A method for exposing a desired pattern on a target with a beam of energetic radiation formed by electrically charged particles, comprising:
  providing a pattern definition device having a plurality of apertures transparent to said radiation, wherein the desired pattern is composed of a plurality of structures having edges oriented along a principal pattern direction,
  illuminating said pattern definition device using an illuminating wide beam, which traverses the pattern definition device through said apertures thus forming a patterned beam comprising a corresponding plurality of beamlets in accordance with said desired pattern,
  forming said patterned beam into a pattern image on the location of the target, said pattern image comprising the images of at least part of the plurality of apertures covering a number of pattern pixels on the target,
  generating a relative movement between said target and the pattern definition device producing a movement of said pattern image on the target along a path over at least one region of exposure where a beam exposure is to be performed, said path being composed of sections which extend along a general direction, said sections corresponding to exposure stripes covering said region in sequential exposures, said region being composed of a plurality of pattern pixels arranged in a regular arrangement and said region having a total width as measured across said general direction, said exposure stripes running substantially parallel to each other along said general direction and having respective widths as measured across said general direction, and introducing a relative orientation of the desired pattern and the exposure stripes, with the relative orientation including a non-zero small angle between the principal pattern direction and the general direction of the exposure stripes, wherein the small angle is sufficient to lift the alignment between said general direction and the principal pattern direction.

2. The method of claim 1, wherein the value of the angle, when represented in radians, is in the order of the value defined by the ratio of the width to the length of the exposure stripes.

3. The method of claim 2, wherein the value of the angle is in the range of 0.5 to 2 times the ratio of the width to the length of the exposure stripes.

4. The method of claim 1, wherein during generating the relative movement between the target and the pattern definition device a target stage is used, said target stage being configured to continuously move the target along a direction of movement, which coincides with one of the principal pattern direction and the general direction.

5. The method of claim 4, wherein a projection system is used to form the patterned beam into a pattern image on the location of the target, and a component of the relative movement transversal to the direction of movement of the target is generated by said projection system.

6. The method of claim 1, wherein introducing a relative orientation of the desired pattern and the exposure stripes includes using a general direction of the exposure stripes where said general direction is rotated by a non-zero angle from a predefined main direction coinciding with said principal pattern direction.

7. The method of claim 1, wherein introducing a relative orientation of the desired pattern and the exposure stripes includes rotating the desired pattern with respect to the general direction of the exposure stripes by a non-zero angle prior to performing the beam exposure.

8. The method of claim 7, where also the orientation of the target is rotated by said non-zero angle.

9. The method of claim 1, wherein the plurality of structures is defined by said edges, said edges being oriented along various directions, wherein a substantial portion, preferably a majority, of said edges is oriented along the principal pattern direction.

10. The method of claim 1, wherein the stripes within a respective region of exposure have uniform width and length.

11. The method of claim 1, wherein the small angle is below a value where significant aliasing effects occur.

12. The method of claim 1, wherein the small angle is less than or equal to 1/MX, where MX is the number of beam lets along the X-direction.

* * * * *